(12) United States Patent
Pawar et al.

(10) Patent No.: US 11,224,134 B2
(45) Date of Patent: Jan. 11, 2022

(54) ELECTRONIC APPARATUS, CIRCUIT ASSEMBLY, AND ASSOCIATED METHOD

(71) Applicant: EATON INTELLIGENT POWER LIMITED, Dublin (IE)

(72) Inventors: Pratik Narendra Pawar, Maharashtra (IN); Saurabh Suresh Yemawar, Maharashtra (IN)

(73) Assignee: EATON INTELLIGENT POWER LIMITED, Dublin (IE)

( * ) Notice: Subject to any disclaimer, the term of this patent is extended or adjusted under 35 U.S.C. 154(b) by 130 days.

(21) Appl. No.: 16/683,676

(22) Filed: Nov. 14, 2019

(65) Prior Publication Data

US 2021/0153361 A1   May 20, 2021

(51) Int. Cl.
*H05K 5/00* (2006.01)
*H05K 5/02* (2006.01)

(52) U.S. Cl.
CPC .......... *H05K 5/006* (2013.01); *H05K 5/0204* (2013.01); *H05K 5/0217* (2013.01); *H05K 5/0247* (2013.01)

(58) Field of Classification Search
CPC .... H05K 5/006; H05K 5/0204; H05K 5/0217; H05K 5/0247
See application file for complete search history.

(56) References Cited

U.S. PATENT DOCUMENTS

| | | | | |
|---|---|---|---|---|
| 4,688,149 A * | 8/1987 | Inoue | ..................... | H05K 3/368 |
| | | | | 361/752 |
| 5,241,451 A * | 8/1993 | Walburn | ................. | H05K 7/142 |
| | | | | 24/453 |
| 5,820,387 A * | 10/1998 | Borisch | ................ | H01R 12/724 |
| | | | | 439/79 |
| 6,186,800 B1 * | 2/2001 | Klein | ....................... | H01R 4/64 |
| | | | | 174/51 |
| 6,567,270 B2 * | 5/2003 | Shieh | .................... | H01L 23/055 |
| | | | | 165/185 |
| 8,031,483 B2 * | 10/2011 | Hsiao | ..................... | H05K 7/142 |
| | | | | 361/807 |
| 8,345,446 B2 * | 1/2013 | Li | ....................... | H04M 1/0249 |
| | | | | 361/807 |

(Continued)

FOREIGN PATENT DOCUMENTS

EP   3 177 115 A1   6/2017

OTHER PUBLICATIONS

European Patent Office, "International Search Report and Written Opinion" for corresponding International Application No. PCT/EP2020/025512, dated Mar. 4, 2021, 10 pp.

*Primary Examiner* — Hung S. Bui
*Assistant Examiner* — Sagar Shrestha
(74) *Attorney, Agent, or Firm* — Eckert Seamans Cherin & Mellott, LLC (57) ABSTRACT

An electronic apparatus includes a circuit assembly having a circuit board that has a number of openings formed therein and a support on which the circuit board is situated and which includes a number of tabs that are received in the number of openings. The circuit assembly further includes a lock that includes a number of lugs that are also received in the openings after the tabs have been received in the openings and which resist the tabs from being dislodged from the openings to thereby retain the circuit board on the support.

10 Claims, 6 Drawing Sheets

(56) References Cited

U.S. PATENT DOCUMENTS

| | | | | |
|---|---|---|---|---|
| 8,472,209 B2* | 6/2013 | Chen | H05K 5/0208 | 361/801 |
| 8,526,192 B2* | 9/2013 | Chen | G06F 1/184 | 361/758 |
| 8,917,519 B2* | 12/2014 | Sano | H05K 7/1417 | 361/756 |
| 8,947,884 B1 | 2/2015 | Grimm et al. | | |
| 10,123,458 B1 | 11/2018 | Dhote et al. | | |
| 10,378,738 B1* | 8/2019 | Davis | F21V 21/042 | |
| 10,645,825 B1* | 5/2020 | Hurt | G08B 13/02 | |
| 2006/0160424 A1* | 7/2006 | Korsunsky | H05K 7/1404 | 439/637 |
| 2007/0246337 A1* | 10/2007 | Verdu | H01H 13/023 | 200/314 |
| 2012/0014075 A1* | 1/2012 | Li | H04M 1/0249 | 361/752 |
| 2012/0260499 A1* | 10/2012 | Rummler | H05K 5/0069 | 29/832 |
| 2013/0170160 A1* | 7/2013 | Sano | H05K 5/0013 | 361/756 |
| 2014/0293568 A1* | 10/2014 | Fu | H05K 7/1409 | 361/803 |
| 2015/0014049 A1* | 1/2015 | Jang | H05K 9/0028 | 174/377 |
| 2015/0029688 A1* | 1/2015 | Fujita | G02F 1/133308 | 361/753 |
| 2015/0289399 A1* | 10/2015 | Liao | H05K 5/0013 | 361/747 |
| 2015/0313027 A1* | 10/2015 | Lin | H05K 5/0047 | 361/752 |
| 2016/0143158 A1* | 5/2016 | Wakana | H05K 5/0013 | 361/752 |
| 2017/0002885 A1* | 1/2017 | Mueller | H05K 7/1417 | |
| 2018/0042128 A1* | 2/2018 | Su | H05K 5/006 | |
| 2019/0150299 A1 | 5/2019 | Naohara et al. | | |
| 2020/0015379 A1* | 1/2020 | Fukuda | H05K 7/14 | |
| 2020/0053888 A1* | 2/2020 | Best | H05K 5/0052 | |
| 2020/0068729 A1* | 2/2020 | Kim | H05K 5/0056 | |

* cited by examiner

ELECTRONIC APPARATUS, CIRCUIT ASSEMBLY, AND ASSOCIATED METHOD

BACKGROUND

Field

The disclosed and claimed concept relates generally to mounting devices and methodologies and, more particularly, relates to a circuit assembly, an electronic apparatus, and a related method wherein a circuit board is resisted from being dislodged from a support.

Related Art

Numerous types of electronic devices and mounting methodologies are known in the relevant art. For instance, numerous types of electrical and electronic devices, such as may include circuit boards such as printed circuit boards and other circuit boards, are often mounted within enclosures. Such enclosure may be employed for reasons of aesthetics, and they also may be employed for reasons of safety to prevent unauthorized access to the electronic components and to thereby avoid a risk of injury. Furthermore, such enclosure may be employed in order to protect the electronic components from damage. Other reasons exist for mounting electronic componentry to other devices and to enclose electronic componentry within enclosures and the like.

It is understood, however, that such mounting of electronic componentry is not without limitation inasmuch as damage can occur to any one or more of the electronic components themselves, the supporting structures upon which such electronic components are mounted, and the enclosures within which such electronic components are situated. For instance, many of the aforementioned structures can be dropped, or alternatively they can be impacted by other structures such as when furniture or equipment is being moved nearby the aforementioned electronic componentry.

It is understood, however, that certain electronic componentry can involve critical types of functions such as smoke detectors, EXIT signs, fire speakers, strobes, and numerous other types of devices. Such devices that serve critical functions are desirably protected against damage of a type that might impair the function thereof. Previous attempts to protect electronic componentry have been expensive or have met with limited success, or both. Improvements thus would be desirable.

SUMMARY

An improved electronic apparatus includes a circuit assembly having a circuit board that has a number of openings formed therein and a support on which the circuit board is situated and which includes a number of tabs that are received in the number of openings. The circuit assembly further includes a lock that includes a number of lugs that are also received in the openings after the tabs have been received in the openings and which resist the tabs from being dislodged from the openings to thereby retain the circuit board on the support. In the depicted exemplary embodiment, the lock includes a cover that covers a mouth into an interior region of an enclosure to which the circuit assembly is mounted.

Accordingly, an aspect of the disclosed and claimed concept is to provide an improved circuit assembly that is usable in applications where a high availability is required.

Another aspect of the disclosed and claimed concept is to provide an improved circuit assembly wherein a number of tabs are received in a number of openings of a circuit board, with the tabs being configured to retain the circuit board in an installed position, and further including a lock that includes a number of lugs that are received in the openings after the tabs have been inserted and which resist the tabs from becoming dislodged from the circuit board.

Accordingly, an aspect of the disclosed and claimed concept is to provide an improved circuit assembly, the general nature of which can be stated as including a circuit board having formed therein a number of openings, a support having a base and having a number of tabs situated on the base, each tab of the number of tabs having a shank that is situated on the base and further having a ledge that is situated on the shank and that protrudes from the shank, a lock that can be stated as including a number of lugs, each opening of at least a subset of the number of openings having a corresponding shank and a corresponding lug received therein, with a portion of the corresponding shank being situated adjacent the circuit board within the opening, with a corresponding ledge that is situated on the corresponding shank overlying a corresponding portion of the circuit board adjacent the opening to retain the corresponding portion of the circuit board disposed between the corresponding ledge and the base, with a portion of the corresponding lug being situated generally between the portion of the corresponding shank and the circuit board within the opening, and with the corresponding ledge protruding from the corresponding shank in a direction generally away from the corresponding lug.

Another aspect of the disclosed and claimed concept is to provide an improved method of affixing a circuit board to a support, the circuit board having formed therein a number of openings, the support having a base and having a number of tabs situated on the base, each tab of the number of tabs having a shank that is situated on the base and further having a ledge that is situated on the shank and that protrudes from the shank. The method can be generally stated as including receiving in each opening of at least a subset of the number of openings a corresponding shank, situating a portion of the corresponding shank adjacent the circuit board within the opening, and overlying a corresponding portion of the circuit board adjacent the opening with a corresponding ledge that is situated on the corresponding shank to retain the corresponding portion of the circuit board disposed between the corresponding ledge and the base and, subsequent thereto, installing a lock having a number of lugs by receiving in each opening of the at least subset of the number of openings a corresponding lug, and situating a portion of the corresponding lug generally between the portion of the corresponding shank and the circuit board within the opening, with the corresponding ledge protruding from the corresponding shank in a direction generally away from the corresponding lug.

BRIEF DESCRIPTION OF THE DRAWINGS

A further understanding of the disclosed and claimed concept can be gained from the following Description when read in conjunction with the accompanying drawings in which:

Similar numerals refer to similar parts throughout the specification.

DESCRIPTION

Figure 1:
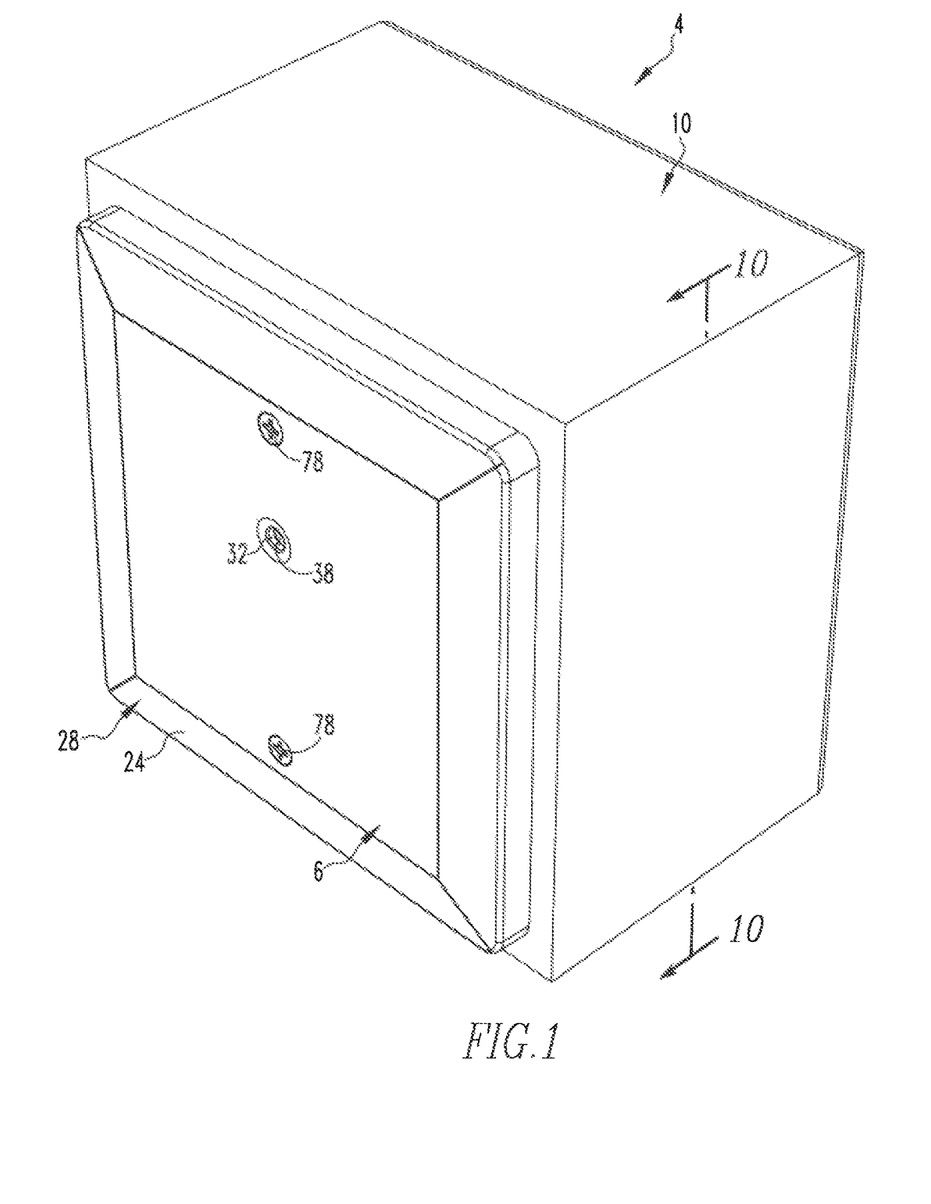
FIG. 1 is a perspective view of an improved electronic apparatus in accordance with the disclosed and claimed concept.
Figure 2:
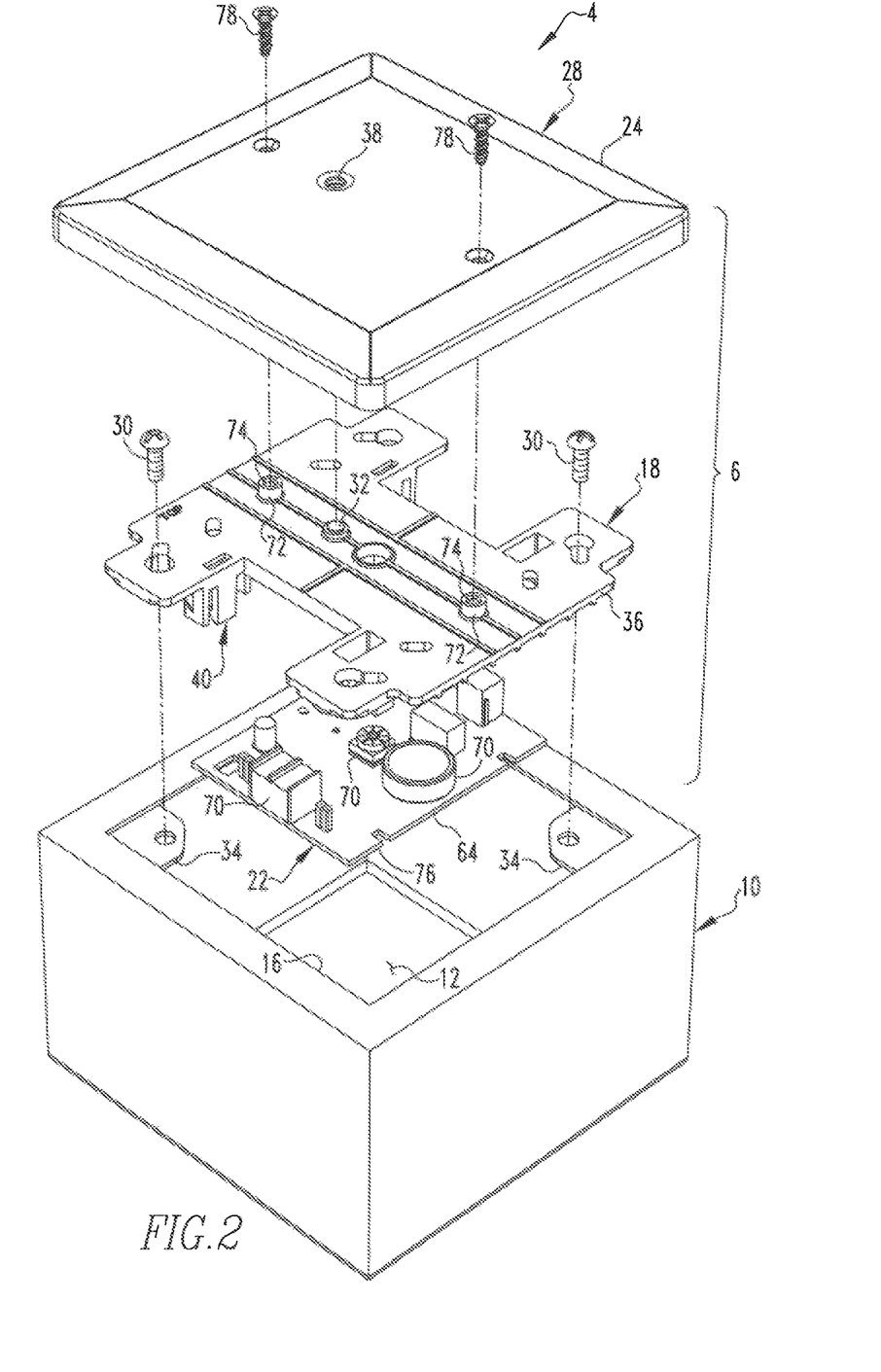
FIG. 2 is an exploded view of the electronic apparatus of FIG. 1 that depicts an improved circuit assembly that is likewise in accordance with the disclosed and claimed concept and which is itself depicted in an exploded condition.

An improved electronic apparatus 4 in accordance with the disclosed and claimed concept is depicted in an assembled condition in FIG. 1 and is depicted in an exploded condition in FIG. 2. As can be seen in FIG. 2, the electronic apparatus can be said to include a circuit assembly 6 and an enclosure 10 having an interior 12, with the circuit assembly 6 being mounted to the enclosure 10, and with a mouth 16 of the enclosure 10 being situated between the interior 12 of the enclosure 10 and the exterior thereof. The enclosure 10 can be any of a wide variety of structures such as circuit boxes, purpose-made boxes, and any of a wide variety of other such structures.

As can further be seen in FIG. 2, the circuit assembly 6 can be said to include a support 18, a circuit board 22, and a cover 24 that serves as a lock 28 to help retain the circuit board 22 in a condition installed on the support 18, as will be discussed in greater detail elsewhere herein. The circuit board 22 can be any of a wide variety of circuit-carrying devices and can include, by way of example, printed circuit boards and other types of non-printed circuit boards without limitation. As can further be understood from FIG. 2, the support 18 is mountable to the enclosure 10 at the mouth 16 by receiving a pair of first screws 30 through a pair of holes that are formed in the support 18, and by further receiving the first screws 30 through an additional pair of holes that are formed in a pair of gussets 34 that are affixed to the enclosure 10 adjacent the mouth 16. As will be set forth in greater detail elsewhere herein, however, the circuit board 22 is first mounted to the support 18, after which the support 18 is affixed to the enclosure 10 by receiving the first screws 30 through the holes formed in the support 18 and by further receiving the first screws in the holes formed in the gussets 34. Thereafter, and as will likewise be set forth in greater detail elsewhere herein, the lock 28 with the cover 24 is mounted to the enclosure 10 by affixing the cover 24 to the support 18. In so doing, and as can be understood from FIGS. 1 and 2, an LED 32 that is situated on the support 18 is aligned with and is viewable through an aperture 38 that is formed in the cover 24.

Figure 3:
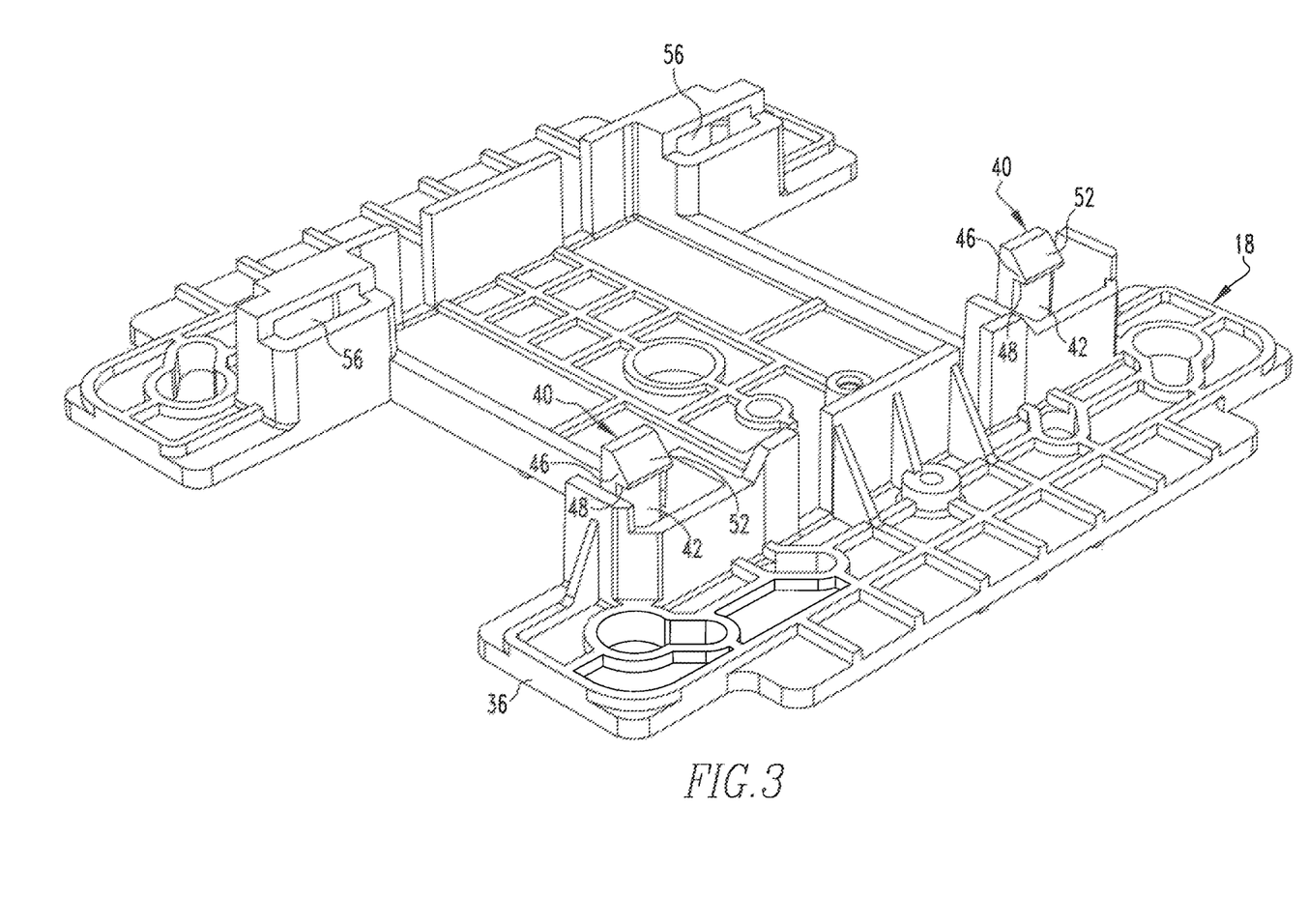
FIG. 3 is a perspective view of a support of the circuit assembly of FIG. 2.

As is shown in FIG. 3 and elsewhere herein, the support 18 can be said to include a base 36 and to further include a number of tabs 40 that are situated on the base 36. As employed herein, the expression "a number of" and variations thereof shall refer broadly to any non-zero quantity, including a quantity of one. Each tab 40 includes an elongated shank 42 that is situated on the base 36 and further includes a ledge 46 that protrudes from the shank at approximately the free end thereof opposite the base 36. Each tab 40 further includes an engagement surface 48 that is situated on the ledge 46 and that faces generally toward the base 36. Each tab 40 further includes a ramped insertion surface 52 that is formed on the ledge 46 at the free end of the tab 40. The support 18 further includes a pair of sockets 56 that are situated on the base 36 and are spaced opposite from the tabs 40, so as to form the fixed support to the circuit board 22.

Figure 4:
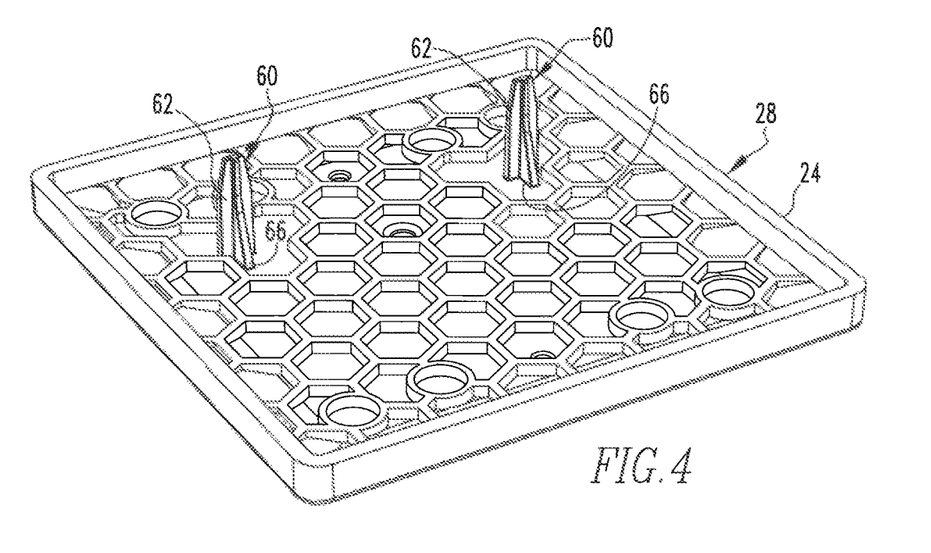
FIG. 4 is a perspective view of a lock of the circuit assembly of FIG. 2.

As can be understood from FIG. 4, the lock 28 includes the cover 24 and further includes a pair of lugs 60 that are upstanding from the cover 24. The lugs 60 and the cover 24 thus together form the lock 28. Each lug 60 includes a blade 62 that extends from the cover 24 and further includes a stiffening rib 66 that likewise extends from the cover 24 but that is of a reduced dimension at the free end of the lug 60 opposite the cover 24.

As can be understood from FIGS. 2 and 5-10, the circuit board 22 has a pair of openings 68 formed therein. For instance, FIG. 2 depicts that the circuit board 22 includes a board portion 64 and a number of electronic components 70 that are situated on the board portion, and that the openings 68 are formed in the board portion 64.

Figure 5:
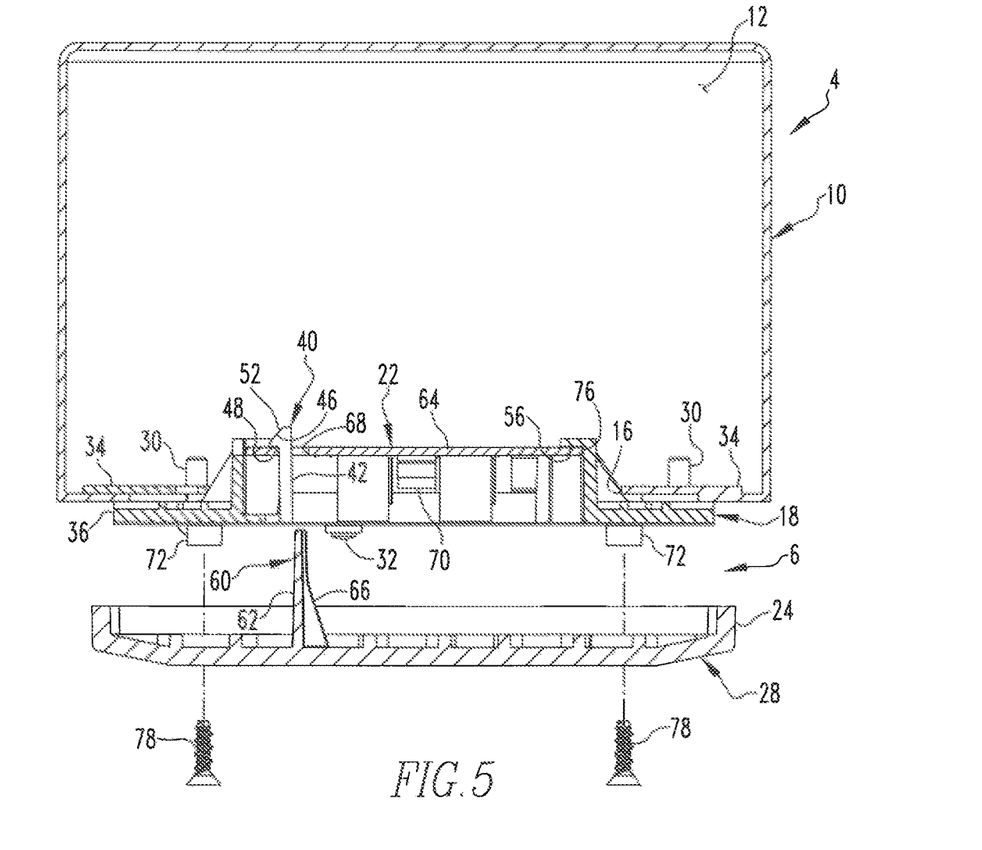
FIG. 5 is a partially exploded view of the electronic apparatus of FIG. 1, partially cut away.

FIG. 5 depicts the circuit board 22 having been mounted to the support 18, and further depicts the support 18 with the circuit board 22 mounted thereon having been mounted to the enclosure 10 using the first screws 30. The exemplary circuit board 22 that is depicted herein is mountable to the support 18 by first receiving an end 76 of the board portion 56 in the sockets 56, as can be understood from FIG. 5, and by thereafter pivoting the circuit board 22 with respect to the base 36 to cause the free end of the tabs 40 to be received in the openings 68 such that an edge of each opening 68 is received against the ramped insertion surface 52 of each tab 40. Continued pivoting of the circuit board 22 toward the base 38 causes the edges of the board portion 64 adjacent the openings 68 to slidingly engage the ramped insertion surfaces 52 to cause the shanks 42 to elastically deflect until the edges of the ledges 46 opposite the shanks 42 clear the openings 68 and elastically spring back toward their free state. In such a situation, the ledges 46 each overlie a portion of the circuit board 22 and serve to retain the circuit board 22 between the engagement surfaces 48 of the ledges 46 and the base 36. It is understood, however, that in other embodiments the circuit board 22 might be mounted to the support 18 in other fashions, such as by employing three or four or more tabs 40 in a like number of openings 68 and without relying upon the sockets 56. In such a situation, the layout and number of the lugs 60 will correspond with the layout and number of the openings 68.

Figure 6:
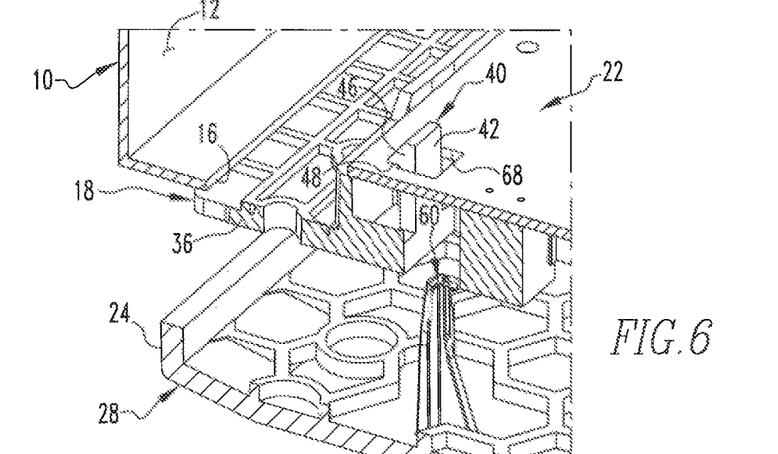
FIGS. 6, 7, and 8 depict the progressive installation of a lug of the lock of FIG. 4 being received in an opening of a circuit board of the circuit assembly of FIG. 2 after a tab of the support of FIG. 3 has already been received in the opening.
Figure 7:
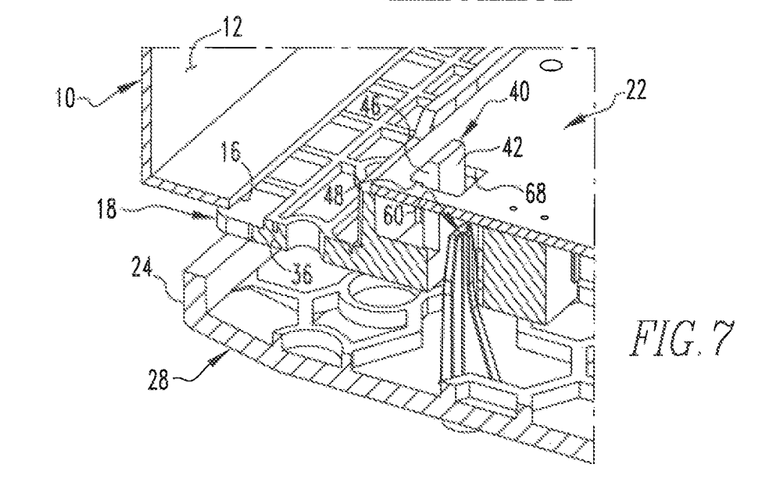
Figure 8:
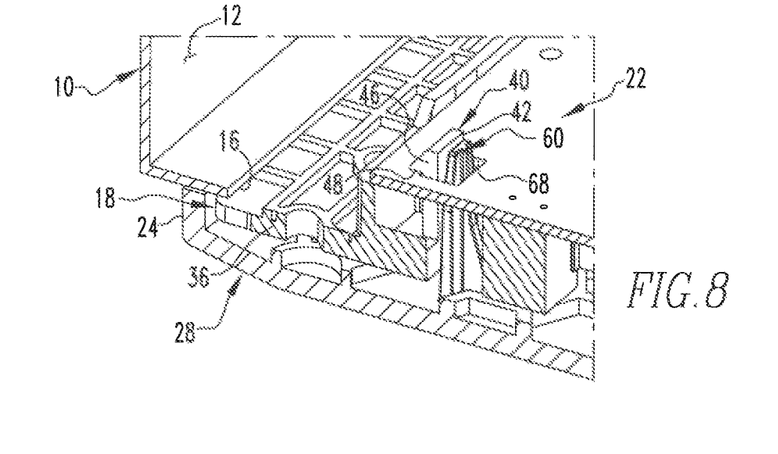

With the circuit board 22 mounted to the support 18, the support 18 can be affixed to the gussets 34 using the first screws 30, which results in the arrangement depicted generally in FIG. 5 wherein the support 18 with the circuit board 22 mounted thereto is affixed to the enclosure 10. After the support 18 with the circuit board 22 mounted thereon is affixed to the enclosure 10, i.e., as in FIG. 5, the lock 28 can then be mounted to the enclosure 10, although in other embodiments the lock 28 can be mounted directly to the enclosure 10. Such mounting is accomplished by employing a pair of second screws 78 that are received in a pair of holes 74 (FIG. 2) that are formed in a pair of bosses 72 that are situated on the base 36 to mount the lock 28 directly to the support 18 and to thereby mount the lock 28 to the enclosure 10. In so doing, the lugs 60 are received in the openings 68 subsequent to the reception of the tabs 40 in the openings 68, such as is depicted in FIGS. 6, 7, and 8, which depict progressive reception of one of the lugs 60 into one of the openings 68 with the corresponding tab 40 already having been received in the opening 68.

Figure 9:
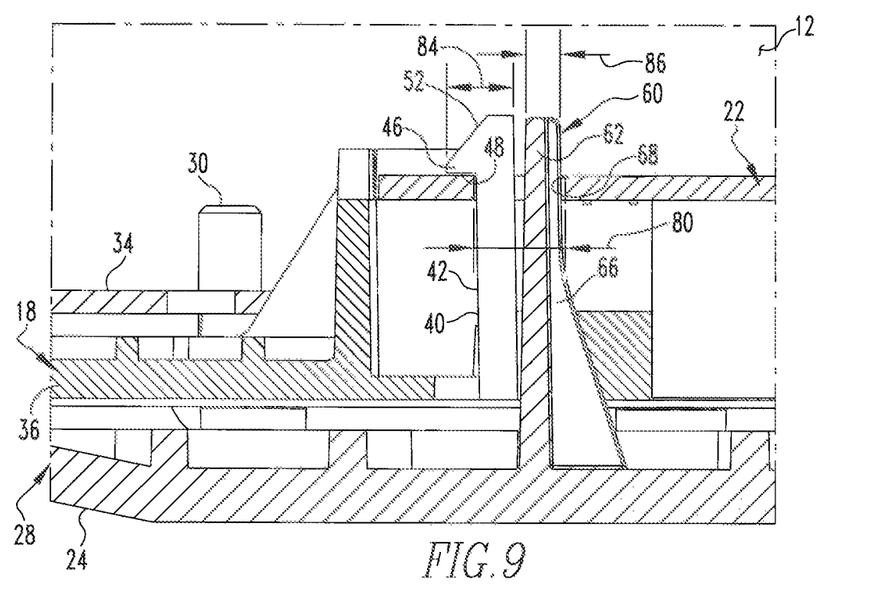
FIG. 9 is a side elevational view of the lug received in the opening.
Figure 10:
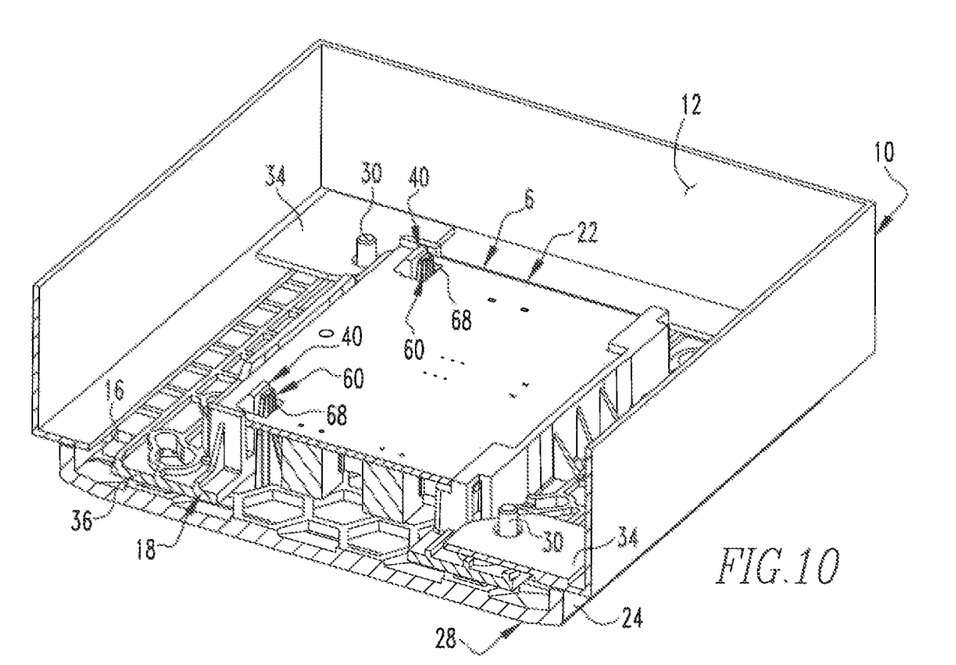
FIG. 10 is a sectional view as taken along line 10-10 of FIG. 1.

With the lugs 60 fully received in the openings 68, as is depicted generally in FIG. 9, and with the cover 24 situated adjacent the base 36, the second screws 78 can be received in the holes 74 formed in the bosses 72 to affix the lock 28 to the support 18 and thus to the enclosure 10. It is understood, however, that other attachment methodologies may be employed to mount the lock 28 to the enclosure 10, such as through the use of ultrasonic welding, through the use of permanent tabs that must be broken in order to remove the lock 28, or any of a number of methodologies that can be employed to retain the lock 28 affixed to the support 18 and the enclosure 10 such that the lugs 60 remain in the openings 68 even in the event of an impact to the electronic apparatus 4 of a dropping thereof during use, installation, or repair.

The presence of the lugs 60 in the openings 68 subsequent to the reception of the tabs 40 in the openings 68 such that the ledges 46 overlie the board portion 64 resists the tabs 40 from becoming disengaged from the circuit board 22. This is illustrated by a set of dimensions in FIG. 9 that include a dimension of the opening 68, which dimension is indicated at the numeral 80, a dimension of the ledge 46 and shank 42, which dimension is indicated at the numeral 84, and a dimension of the lug 60, which dimension is indicated at the numeral 86. The dimension 80 of the opening 68 can be understood to be greater than the dimension 84 of the ledge 46 and shank 42. It is noted that the dimension 84 is representative of the space that is required for insertion of the tab 40 through the opening 68 to result in the engagement surface 48 being situated adjacent the board portion 64, and is also the space required to remove the tab 40 from the opening 68. Such reception of the tabs 40 through the openings 68 occurs, as noted elsewhere herein, when the circuit board 22 is mounted to the support 18. As can further be seen in FIG. 9, however, the dimension 86 of the lug 60 is such that when the lug 60 is present in the opening 68, the tab 40 cannot be removed from the opening 68. This is because when the dimension 86 of the lug 60 is subtracted from the dimension of the opening 80, this results in a remaining space within the opening 68 that is smaller than the dimension of the ledge 84. As such, when the lug 60 is received in the opening 68 subsequent to the reception of the tab 40 in the opening 68, such as is depicted generally in FIG. 9, the circuit board 22 cannot be removed from the tabs 40 while the tabs 40 are intact, i.e., meaning that the circuit board 22 cannot be removed from the tabs 40 when the lugs 60 are present, as in FIG. 9, without destroying the tabs 40 or the circuit board 22 or both. This is to say that the presence of the lugs 60 in the openings 68 subsequent to the reception of the tabs 40 in the openings 68 resists the circuit board 22 from being removed from the support 18. This advantageously permits continued proper operation of the electronic apparatus 4 even in the event of certain impacts such as dropping of the electronic apparatus 4, hitting the electronic apparatus 4 with other objects, and the like. This advantageously permits continued operation of the electronic apparatus 4, which is desirable in a high criticality application. Other advantages will be apparent.

An improved method in accordance with the disclosed and claimed concept can be understood from the foregoing. The method begins with receiving the circuit board 22 on the support 18 and receiving the tabs 40 in the openings 68 such that the engagement surfaces 48 overlie portions of the board portion 64 and thus retain the board portion 64 between the ledges 46 and the base 36, and thereby mounting the circuit board 22 to the support 18. Subsequent thereto, the lugs 60 are received in the openings 68 such that portions of the lugs are situated between portions of the shanks 42 and the edges of the board portion 64 within the openings 68 and such that the ledges 46 protrude away from the shanks 42 in a direction that is generally away from the lugs 60. The second screws 78 can then be received in the holes 74 that are formed in the bosses 72 to affix the lock 28 to the support 18 and thus to the enclosure 10. In so doing, it can be seen that the circuit assembly 6 is mounted to the enclosure 10 in the vicinity of the mouth 16 and that the circuit board 22 is situated within the interior 12 of the enclosure 10 adjacent the mouth 16. The cover 24 covers the mouth 16 and encloses the circuit board 22 within the interior 12 of the enclosure 10.

The electronic apparatus 4, the circuit assembly 6, and the method noted herein thus advantageously enable the continued operation of the electronic apparatus 4 by avoiding detachment of the circuit board 22 from the support 18 despite various impacts that may occur with respect to the electronic apparatus 4. An additional advantage is use of minimal parts to achieve the robustness of the device. There is no additional part below circuit board 22 for extra support inasmuch as the circuit board 22 is only supported by the tabs 40 and the sockets 56. Furthermore, it is noted that the structured and methodologies noted herein can be applied to any plastic structures and is not limited to electronic or circuitry-related structures, and moreover is not limited to structures having highly critical functions or application. Other advantages and variations will be apparent and will be within the scope of the spirit of the instant disclosure.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. An electronic apparatus comprising:
an enclosure having an interior; and
a circuit assembly mounted to the enclosure and situated at least in part within the interior;
the circuit assembly comprising:
a circuit board having formed therein a number of openings;
a support having a base and having a number of tabs situated on the base, each tab of the number of tabs having a shank that is situated on the base and further having a ledge that is situated on the shank and that protrudes from the shank;
a lock comprising a number of lugs;
each opening of at least a subset of the number of openings having a corresponding shank and a corresponding lug received therein, with a portion of the corresponding shank being situated adjacent the circuit board within the opening, with a corresponding ledge that is situated on the corresponding shank overlying a corresponding portion of the circuit board adjacent the opening to retain the corresponding portion of the circuit board disposed between the corresponding ledge and the base, with a portion of the corresponding lug being situated between the portion of the corresponding shank and the circuit board within the opening, and with the corresponding ledge protruding from the corresponding shank in a direction away from the corresponding lug;

the lock comprising another base, the number of lugs being situated on the another base;

the base being affixed to the enclosure with a number of fasteners; and the another base being affixed to the base.

2. The circuit assembly of claim 1 wherein the base and the another base are affixed together with at least one of a threaded fastener, an ultrasonic weld, an adhesive, and a number of permanent tabs which need to be broken off if needed to disassemble.

3. The circuit assembly of claim 1 wherein at least one of at least a first opening of the number of openings and at least a first tab of the number of tabs has an angled insertion ramp formed thereon.

4. The circuit assembly of claim 1 wherein the circuit board is installed in a number of sockets by inclined insertion and then followed by pivoting action to lock the circuit board with the number of tabs.

5. The electronic apparatus of claim 1 wherein the another base includes a cover that overlies the interior.

6. The electronic apparatus of claim 1 wherein each tab of the number of tabs has an angled insertion ramp formed thereon.

7. A method of affixing a circuit board to a support and to an enclosure having an interior, the circuit board having formed therein a number of openings, the support having a base and having a number of tabs situated on the base, each tab of the number of tabs having a shank that is situated on the base and further having a ledge that is situated on the shank and that protrudes from the shank, comprising:

receiving in each opening of at least a subset of the number of openings a corresponding shank, situating a portion of the corresponding shank adjacent the circuit board within the opening, and overlying a corresponding portion of the circuit board adjacent the opening with a corresponding ledge that is situated on the corresponding shank to retain the corresponding portion of the circuit board disposed between the corresponding ledge and the base;

subsequent thereto, affixing the circuit board to the enclosure and situating the circuit board at least partially within the interior by affixing the support to the enclosure; and subsequent thereto, installing a lock having a number of lugs by receiving in each opening of the at least subset of the number of openings a corresponding lug, and situating a portion of the corresponding lug between the portion of the corresponding shank and the circuit board within the opening, with the corresponding ledge protruding from the corresponding shank in a direction away from the corresponding lug.

8. The method of claim 7, wherein the lock further includes another base, the number of lugs being situated on the another base, and wherein the affixing of the support to the enclosure comprises affixing the another base to the base.

9. The method of claim 8 wherein the another base includes a cover, and further comprising attaching the cover over the interior.

10. The method of claim 9, further comprising affixing together the another base and the base with at least one of a threaded fastener and an ultrasonic weld.

* * * * *